United States Patent [19]

Vranish

[11] Patent Number: 5,079,460
[45] Date of Patent: Jan. 7, 1992

[54] MAGNETOSTRICTIVE ROLLER DRIVE MOTOR

[75] Inventor: John M. Vranish, Crofton, Md.

[73] Assignee: United States of America as represented by the Administrator, National Aeronautics & Space Administration, Washington, D.C.

[21] Appl. No.: 645,972

[22] Filed: Jan. 10, 1991

[51] Int. Cl.⁵ .................................. H04R 15/00
[52] U.S. Cl. .................................. 310/26; 310/83; 310/265; 367/156
[58] Field of Search .................. 310/26, 83, 99, 66, 310/67 R, 264, 265, 20, 37, 80, 49 R; 367/156, 158, 168, 189

[56] References Cited

U.S. PATENT DOCUMENTS

| | | | |
|---|---|---|---|
| 3,459,126 | 8/1969 | Nyman | 310/26 |
| 4,901,293 | 2/1990 | Kuhn | 367/168 |
| 4,907,209 | 3/1990 | Sewell et al. | 310/26 |
| 4,914,330 | 4/1990 | Pierrat | 310/83 |

OTHER PUBLICATIONS

"An Application of Giant Magnetotstrictive Material to High Power Actuators", T. Akuta, Proceedings, 10th International Workshop on Rare Earth Magnets and Their Applications, May 16-19, 1989, pp. 359-368.
"Ultrasonic Motor", Panasonic Technical Reference, Electric Motor Division, Matsushita Electric Industrial Co., Ltd. pp. 1-10.

*Primary Examiner*—Steven L. Stephan
*Assistant Examiner*—Matthew Nguyen
*Attorney, Agent, or Firm*—R. Dennis Marchant; Harold W. Adams; Paul S. Clohan

[57] ABSTRACT

A magnetostrictive drive motor having a rotary drive shaft in the form of a drum which is encircled by a plurality of substantially equally spaced roller members in the form of two sets of cones which are in contact with respective cam surfaces on the inside surface of an outer drive ring. The drive ring is attached to sets of opposing pairs of magnetostrictive rods. Each rod in a pair are mutually positioned end to end within respective energizing coils. When one of the coils in an opposing pair is energized, the energized rod expands while the other rod is caused to contract, causing the drive ring to rock, i.e. rotate slightly in either the clockwise or counterclockwise direction, depending upon which rod in a pair is energized. As the drive ring is activated in repetitive cycles in either direction, one set of drive cones attempt to roll up their respective cam surface but are pinned between the drive shaft drum and the drive ring. As the frictional force preventing sliding builds up, the cones become locked, setting up reaction forces including a tangential component which is imparted to the drive shaft drum to provide a source of motor torque. Simultaneously the other set of cones are disengaged from the drive shaft drum. By repetitively cycling the energization of the magnetostrictive rods, the drive shaft drum indexes in microradian rotational steps.

20 Claims, 4 Drawing Sheets

MAGNETOSTRICTIVE ROLLER DRIVE MOTOR

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

This invention relates generally to stepping motors and more particularly to a compact, self-braking, high torque, precision magnetostrictive stepping motor particularly adapted for robotic applications.

Robot arms used in zero gravity environments, such as outer space, are typically powered by low torque, high speed electric motors which use transmissions as a means of torque multiplication and employ some type of braking system as a safety device when the power is shut off. Direct drive control is extremely desirable but heretofore included inherent limitations so as to be impractical and in some instances, unworkable. The addition of the transmission hardware and the associated braking apparatus renders the system bulky and extremely inefficient.

Stepping motors whose operation is based upon magnetostrictive principles are generally known and provide a means for alleviating the aforementioned problems and to exhibit enhanced precision in movement, safety and agility. Various types of magnetostrictive devices are generally known, including both linear and rotary motors. A rotary motor has a fundamental advantage over a linear motor in that a linear motor has a finite distance or stroke that it can travel. A rotary motor, on the other hand, makes multiple revolutions and thus it can move objects much farther than a linear motor. Also because a rotary motor can make many rotations, gearing techniques can be used to exchange this rotary motion for increases in torque, force, or speed depending on the particular application.

Accordingly, it is an object of the present invention to provide an improvement in electric motors.

It is another object of the invention to provide an improvement in stepping motors which provide a relatively high output torque.

It is still a further object of the invention to provide a magnetostrictive stepping motor which exhibits self-braking, precision rotational movement and direct drive to a load.

And it is still another object of the invention to provide a magnetostrictive drive motor which is particularly adapted for use with heavy duty applications including, but not necessarily limited to, zero gravity environments.

SUMMARY

Briefly, the foregoing and other objects are achieved by a magnetostrictive drive motor comprised of a rotary drive shaft in the form of a drum which is encircled by a plurality of substantially equally spaced roller members in the form of cones which are in contact with respective cam surfaces on the inside surface of an outer drive ring. The drive ring is attached to at least one opposing pair of magnetostrictive rods. Each rod in a pair are mutually positioned end to end within respective energizing coils. When one of the coils of the pair is energized, the energized rod expands while the other rod is forced to contract, causing the drive ring to rotate slightly in one direction either the clockwise or counterclockwise direction. Energization of the other coil causes the other rod to expand and thus effect rotation in the other direction. As the drive ring is rotated in repetitive cycles, the drive cones attempt to roll up their respective cam surface but are pinned between the drive shaft drum and the drive ring. As the frictional force preventing sliding builds up, the cones become locked, setting up reaction forces including a tangential component which is imparted to the drive shaft drum to provide a source of motor torque. Upon deactivation of the energized magnetostrictive rod coil, the force on the drive cones is released, causing the system to return to neutral. By repetitively cycling the energization of the coils, the drive shaft drum incrementally rotates in microradian steps. When the coils are excited at a relatively high frequency, the system cycles in a rapid ratcheting motion to provide a relatively high rotational motion of the drum in a selected direction.

BRIEF DESCRIPTION OF THE DRAWING

The following detailed description will become more readily understandable when considered together with the accompanying drawings in which.

DETAILED DESCRIPTION OF THE INVENTION

Figure 1:
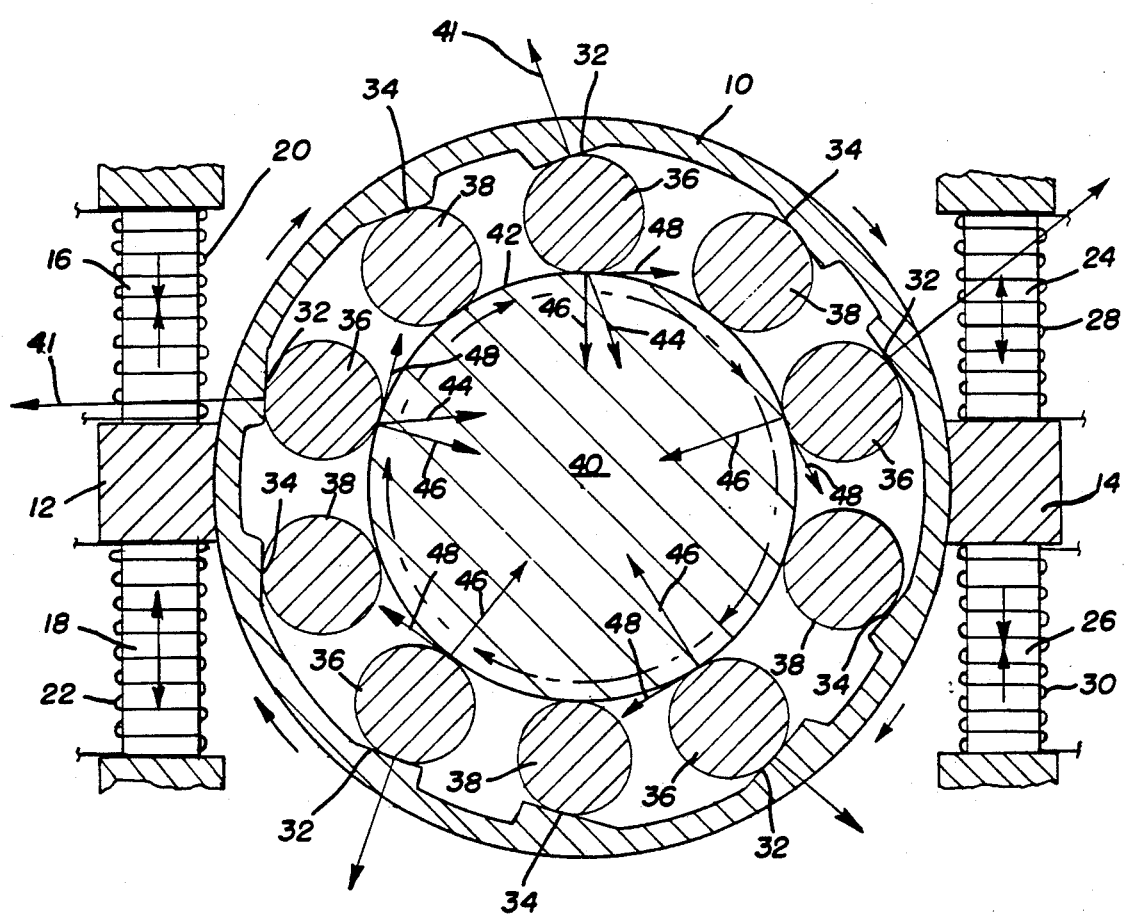
FIG. 1 is a top plan view generally illustrative of a basic embodiment of the invention.

Referring now to the drawings and more particularly to FIG. 1, reference numeral 10 denotes a circular drive ring which is attached to two block type elements 12 and 14 which are located diametrically opposed to one another on the outer surface of the ring 10. A first pair of magnetostrictive rods 16 and 18 are located on opposite sides of the block 12 in mutual alignment with one another. Each of the magnetostrictive rods 16 and 18 have individual energization coils 20 and 22 wrapped around the length of the rods 16 and 18. In a like manner, a second pair of linearly aligned magnetostrictive rods 24 and 26 are attached to the block 14 on the opposite side of the ring 10 and additionally include respective energization coils 28 and 30. A rod can only expand while being energized. Energization will not cause it to contract; however, the expansion of one rod, e.g. rod 18, will cause the other rod 16 to contract. Likewise, with respect to the second pair of rods 24 and 26, the rod 24 when energized expands to cause the rod 26 to contract and vice versa. Thus mutually diagonal coils when energized aid one another. Being energized as shown causes a rotational movement of the ring 10 in the clockwise direction. If, on the other hand, coils 20 and 30 are energized, magnetostrictive rods 16 and 26 would be caused to expand, while the rods 18 and 24 would contract. This would impart a counterclockwise rotation to the ring 10. Upon deenergization of all the coils, the drive ring 10 returns to its initial or rest position.

Further as shown in FIG. 1, the inside surface of the ring 10 includes two sets of spaced cam surfaces 32 and 34 which alternately slant in mutually opposite directions. Associated with the cams 32 is a first set of roller members 36 of circular cross section, while a second set of roller members 38 are in contact with the second set of cam surfaces 34. The roller members 36 and 38 are actually conical in shape like the roller member in the preferred embodiment of the invention depicted in FIG. 4.

The roller members 36 and 38 must be conical so that they: (a) can be moved in or out of contact with a drive drum 40 by a magnetic lifter, not shown; (b) they can independently and individually be kept in contact with the drive drum 40; and (c) they can compensate for wear.

Interiorly of the roller members 36 and 38 is the contacting drive drum 40 whose outer surface 42 is in intimate contact with all of the roller members 36 and 38. The principle of operation is based upon the roller contact between the cam surfaces 32 and 34 with their respective roller members 36 and 38 in contact with the drum 40 which, as will be shown, operates as a drive shaft.

Further as shown in FIG. 1, upon energization of one of the magnetostictive rods in each pair 16, 18 and 24, 26, the rods 18 and 24, for example, expand 0.001 in./in. under the influence of the magnetic fields generated by the coils 22 and 28, while the rods 16 and 26 contract by the same amount. This causes a corresponding partial rotation of the drive ring 10. As the ring 10 rotates clockwise, the roller members 36 try to roll up the cams 32 but are immediately pinned between the respective cam and the drive shaft drum 40. The roller members 38 are unaffected since the surface of the cams 34 tend to loosen contact therewith. Since the frictional force preventing sliding of the roller members 36 builds up instantly so that the roller members 36 lock against the surface 42 of the drive shaft drum 40. This locking action sets up reaction forces between the drive ring 10 and the drum 40 as shown. Although not shown to scale, the reaction force 41 between the cam 32 and the roller 36 is accompanied by an action force 44 at the surface 42 which has two components, one being a radial component 46 and the other being a tangential component 48. The tangential component comprises a torquing force on the drum 40 and is exerted by all of the rollers 36 in contact with the drum surface 42. Alternatively, a counterclockwise rotation of the ring 10 will cause the same action to occur between the cams 34 and the roller members 38 against the surface 42 of the drum, causing a torque in the opposite direction. Thus depending upon which coils of the coil pairs 20, 22 and 28, 30, are energized, a clockwise or counterclockwise rotation of the drum is produced.

Figure 2:
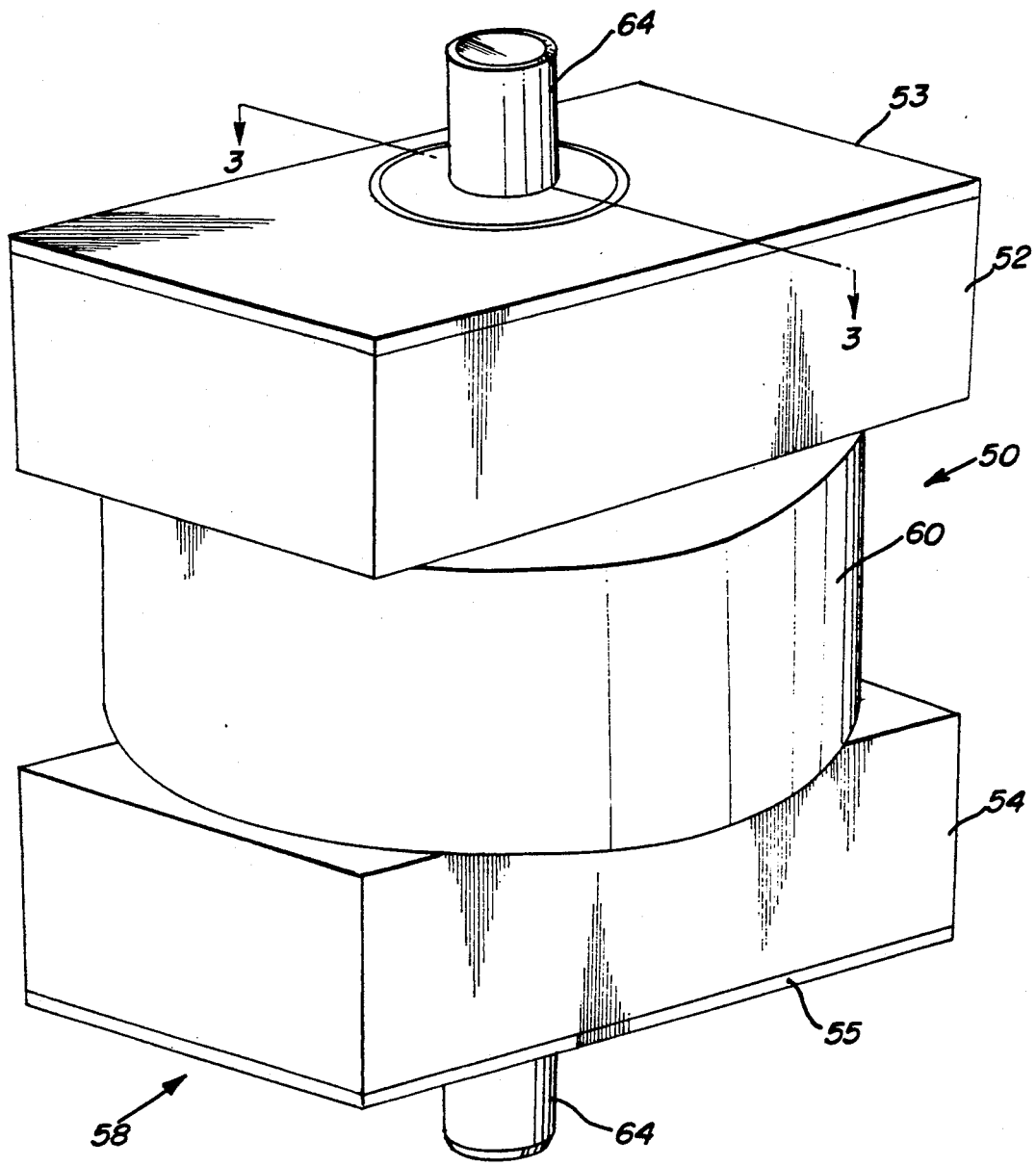
FIG. 2 is a perspective view illustrative of a housing for the preferred embodiment of the invention.
Figure 3:
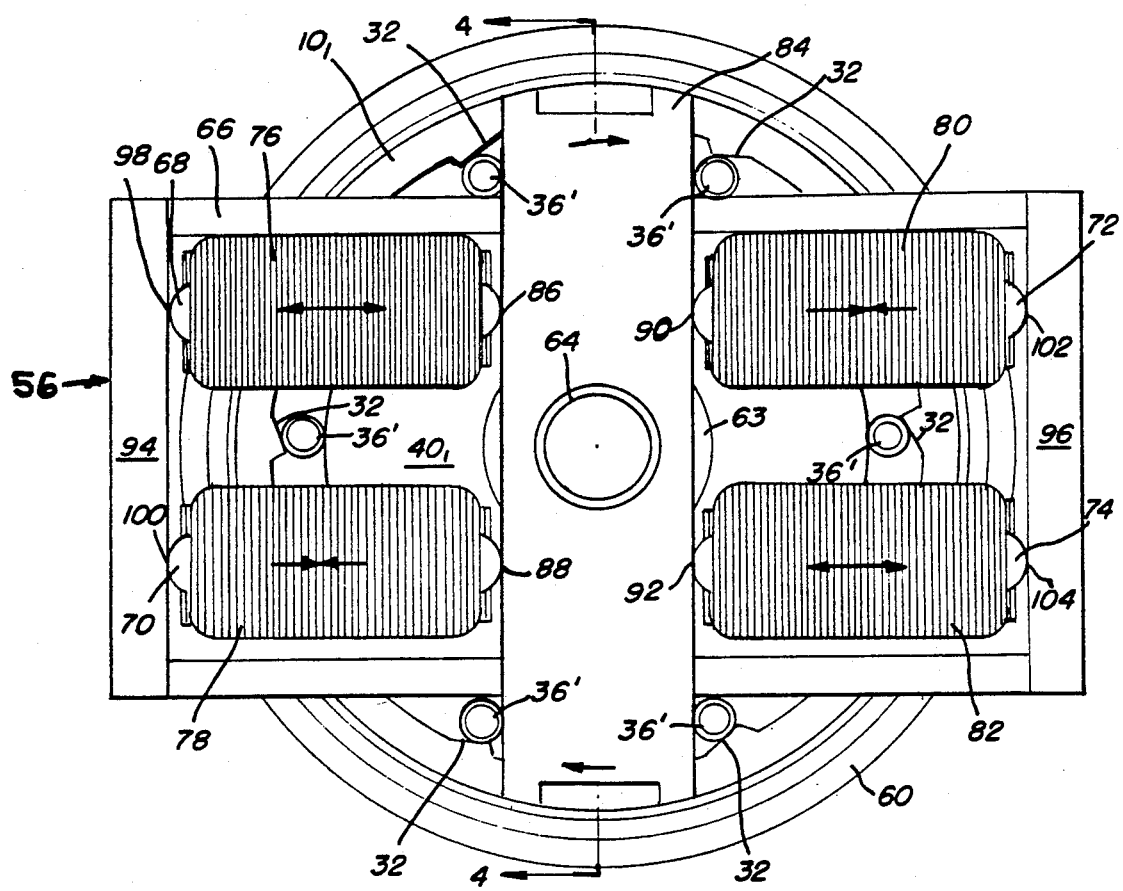
FIG. 3 is a top planar view illustrative of the preferred embodiment of the invention and taken along the lines 3—3 of FIG. 2.

The foregoing description now leads to a consideration of the preferred embodiment of the invention which is illustrated in FIGS. 2-5. Reference is now made briefly to FIG. 2 which is intended to show the physical configuration of a structure 50 which is comprised of an upper and lower generally rectangular housings 52 and 54 including respective top and bottom plates 53 and 55 for supporting upper and lower magnetostrictive drive assemblies, the top assembly of which is shown in FIG. 3 by reference numeral 56, with an identical assembly being located in a lower enclosure 54 and being identified by reference numeral 58 in FIG. 4.

Figure 5:
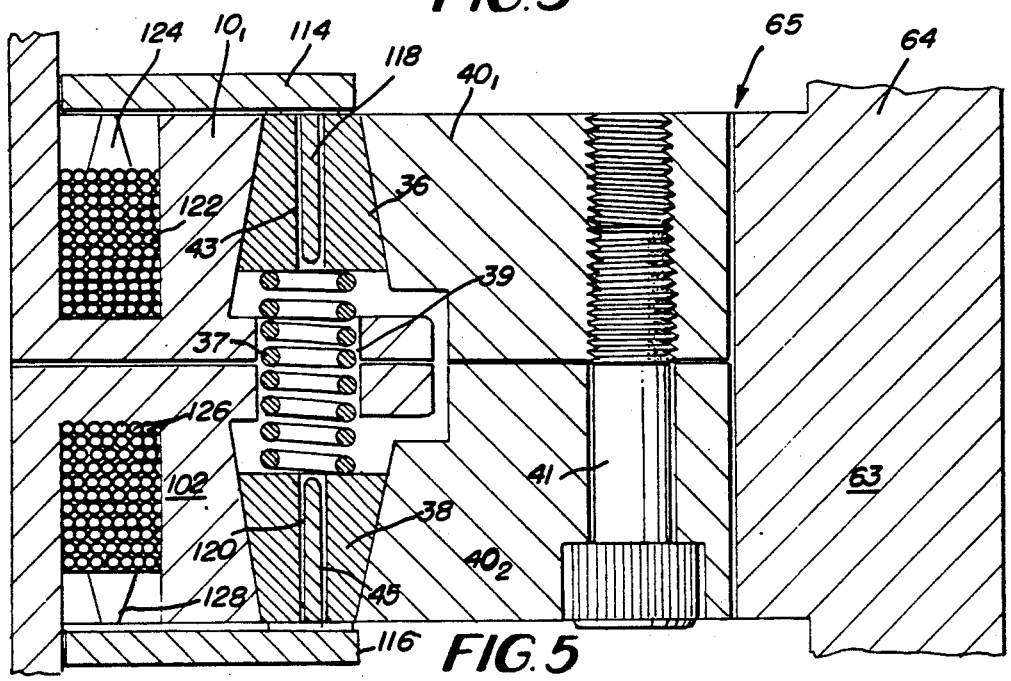
FIG. 5 is an enlarged fragmentary view illustrative of a portion of the embodiment shown in FIG. 4.
Figure 4:
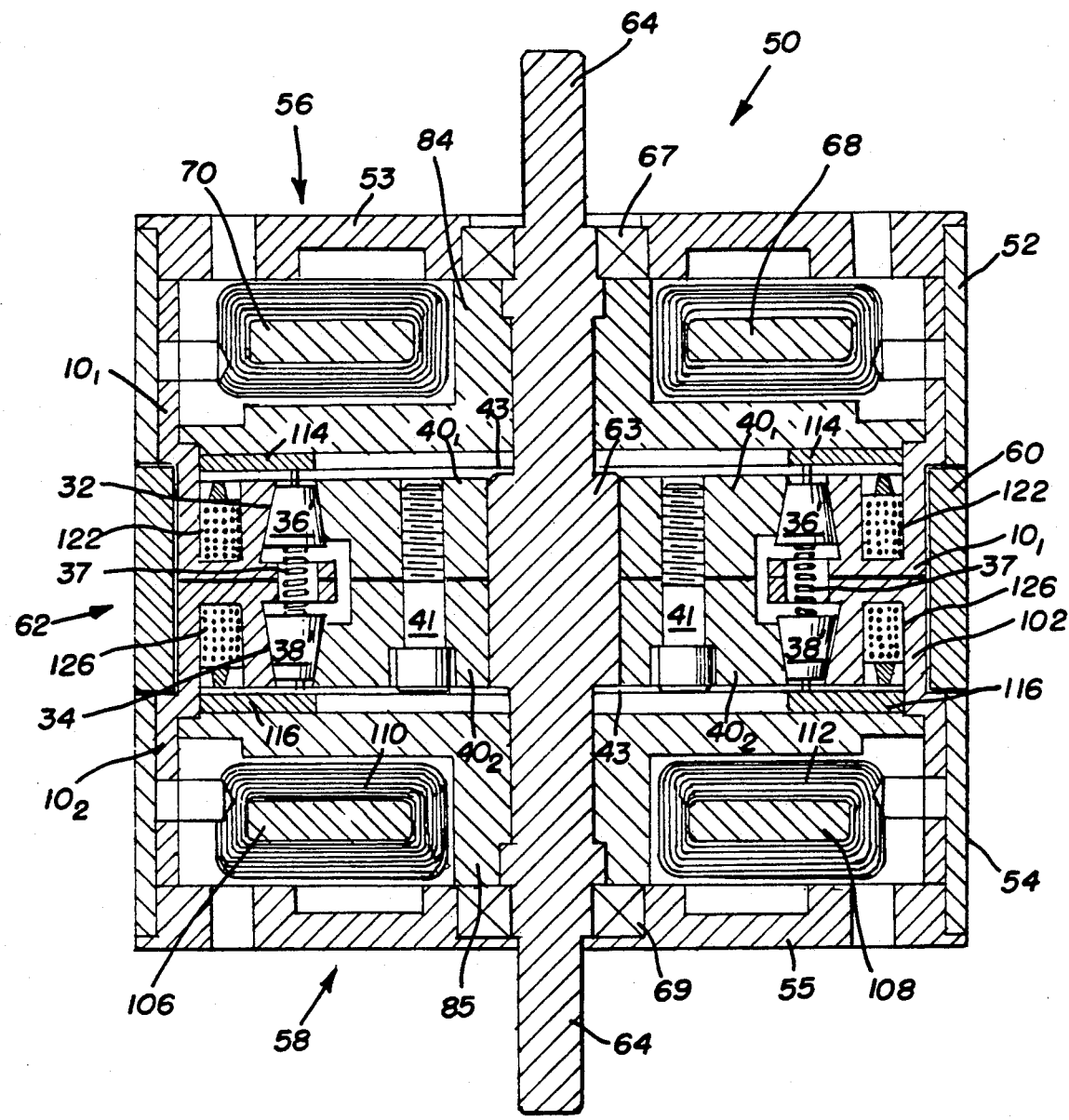
FIG. 4 is a central cross sectional view of the preferred embodiment shown in FIG. 3 taken along the lines 4—4 thereof.

As shown in FIG. 4, intermediate the two housings 52 and 54 is a circular band member 60 for enclosing a split drive ring and drive shaft drum assembly 62, comprised of upper and lower drive ring halves $10_1$ and $10_2$ and upper and lower drive shaft drums $40_1$ and $40_2$ bolted together by one or more threaded bolts 41. The drum halves $40_1$ and $40_2$ couple to an enlarged portion 63 of a drive shaft 64 by intermeshed gearing, not shown, at 65 (FIG. 5). Further as shown in both FIGS. 2 and 4, the drive shaft 64 protrudes from either end of the drive motor assembly while being held in position by a pair of bearings 67 and 69 located in the top and bottom plates 53 and 55.

As shown in FIG. 3, the upper magnetostrictive rod assembly 56 (FIG. 4) is comprised of a generally rectangular frame 66 within which are located four magnetostrictive rod members 68, 70, 72 and 74 and their respective energizing coils 76, 78, and 80, 82. The rods are arranged in pairs 68, 70 and 72, 74 on either side of an elongated drive plate 84 which pivots about the shaft 64 while being physically connected at either end to the upper driver ring $10_1$.

Ring $10_1$ differs from the drive ring 10 shown in FIG. 1 in that it contains only one set of cams, i.e. the cams 32 (FIG. 1) for effecting clockwise rotation of both drum halves $40_1$ and $40_2$, while the lower ring $10_2$, which is shown in cross section in FIG. 4, includes the other set of cams 34 for producing counterclockwise rotation of the drum halves $40_1$ and $40_2$.

Shown positioned between the cams 32 and the drum $40_1$ are a respective number of truncated conical members 36' and which are shown in cross section in FIG. 4. Further, as shown in FIG. 3, the four magnetostrictive rods 68, 70, 72 and 74 are oriented perpendicularly with respect to the plate 84 and being secured thereto at the points 86, 88, 90 and 92. The opposite ends are connected to the cross members 94 and 96 of the frame 56 at the points 98, 100, 102 and 104. In a like manner, the lower half of the motor assembly includes a second drive plate 85 which is identical to the plate 84 shown in FIG. 3 and is also attached to the drive shaft 64. Energization of the coils 76 and 80, as shown in FIG. 3, will impart a clockwise rotation on the plate 84 and likewise the drive ring $10_1$. As noted above, rotation of the drive ring $10_1$ causes the cams 32 to pin their respective roller members, in this instance conical members 36', against the surface of the drive drum, which in this embodiment comprises the upper half $40_1$ of the drive drum assembly and acts to impart a tangential torquing force on the drum portion $40_1$. An opposite motion would be imparted to the lower half drive drum portion $40_2$ by the operation of the upper coils 78 and 80 and two coils of a set of four magnetostrictive drive rods, two of which are shown in FIG. 4 by reference numerals 106 and 108. Also shown wrapped therearound are respective energizing coils 110 and 112. Thus the top and bottom halves of the configuration shown in FIG. 4 perform the same operation as a single drive ring 10 and drum 40 combination shown in FIG. 1.

Another significant departure from the embodiment shown in FIG. 1 is the arrangement of the cones 36' and 38' shown in FIGS. 4 and 5. There the two sets of cones 36' and 38' are arranged so that their smaller diameter ends are pointing in opposite directions, i.e. outwardly. The cones 36' and 38', moreover, are mutually aligned and are biased away from each other by a common compression spring 37 located in a bore 39 formed in the drive ring halves $10_1$ and $10_2$. Additionally, a pair of upper and lower magnetizable plates 114 and 116 are located above the sets of cones 36' and 38', respectively, and include spring type spindle members 118 and 120 which project down into small axial bores 43 and 45 formed in the cones 36' and 38'. The spring elements 118 and 120 keep the cones 36' and 38' in their respective places, yet enable them to roll slightly during the roller locking process, i.e. they locate the cones (roller members) with respect to drive drum cones 32 and 34. They also permit the cones 36' and 38' to roll back during the return stroke. When a set of cones 36' and 38' is lifted, the spring spindles 118 and 120 additionally vector the roller members 36' and 38' away from the surface of drive drum $40_1$ and $40_2$. An annular magnetizing coil 122 wound on a core 124 is located outwardly of the upper set of cones 36' and beneath the annular plate 114. In a like manner, an annular energizing coil 126 wound on the core 128 is located outwardly of the cones 38' and beneath the plate 116.

The purpose of the magnetizable plates 114 and 116 is as follows. As mentioned above, when the upper magnetostrictive rods 68 and 74 are energized, a clockwise rotation is imparted to the upper drive ring $10_1$ through the action of the plate 84 which pivots about the shaft 64 as shown in FIG. 3. At the same time the upper coils 76 and 82 are energized, the lower plate coil 126 is energized, causing the plate 116 to be drawn against the outer surface of the lower set of cones 38' causing the cones to become disengaged from the surface of the drum portion $40_2$, thus establishing a clockwise torque and motion of the drive shaft drive drum consisting of the two drum halves $40_1$ and $40_2$. Upon deenergization of the aforementioned coils, the system returns to neutral and the cycle can be repeated again and the counterclockwise direction cones 38' are effectively nonparticipatory. An energization of the magnetizing coil 128 occurs along with magnetization of the lower set of magnetostrictive rods 106, 108, etc. to generate a counterclockwise ratcheting motion. Thus when the respective magnetic fields are excited at relatively high frequency, e.g. 400 Hz, the system cycles in a rapid ratcheting motion, which results in a relatively high RPM output of the shaft 64.

A magnetostrictive drive motor constructed in accordance with the principles shown and described herein results in dead zones, hysteresis and loss of stroke through deflections and deformations of the structure being minimized. The use of multiple cams permits the drive rollers to act as if they are independently suspended and permits the cones, for example, to adjust independently to wear and manufacturing anomalies while in use, which also results in enhancing the useful life of the motor. The cone roll locking motion furthermore reduces wear during power stroke and no load rolling motion virtually eliminates wear during the return stroke. One further feature which is extremely important is that the roller locking system provides a self-braking fail-safe mode with power off.

Having thus shown and described what is at present considered to be the preferred embodiments of the invention, it should be noted that the same has been made by way of illustration and not limitation. Accordingly, all modifications, alterations and changes coming within the spirit and scope of the invention are herein meant to be included.

I claim:
1. A magnetostrictive drive motor, comprising:
   a drive shaft drum of circular cross section;
   a drive ring encircling the drive shaft drum and having an inner circumferential surface including at least one plurality of like raised cam surfaces, said cam surfaces further having a predetermined spaced relationship;
   a respective plurality of roller members located between the drive shaft drum and the drive ring and being in rolling contact with an outer surface of the drum and the plurality of cam surfaces; and
   magnetostrictive drive means secured to the drive ring and being activated to rotate the drive ring in a predetermined direction, causing the roller members to ride up the cam surfaces and be pinned against the outer surface of the drum thereby generating an inward force having a radial and tangential component, said tangential component producing a torque on the drive shaft drive drum.
2. The magnetostrictive drive motor as defined by claim 1 wherein said drive means comprises at least one magnetostrictive rod member and an electrical activating coil therefor, whereby the energization causes said rod member to expand and thereby impart rotary motion to said drive ring.
3. The magnetostrictive drive motor as defined by claim 1 wherein said drive means comprises a pair of magnetostrictive rod members and having a respective electrical activating coil wrapped therearound, said coils being selectively energized to cause the respective rod to expand and thereby impart rotary motion to said drive ring.
4. The magnetostrictive drive motor as defined by claim 3 wherein said pair of rod members are mutually aligned and having opposing ends secured to said drive ring at substantially the same location thereof.
5. The magnetostrictive drive motor as defined by claim 1 wherein said one plurality of cam surfaces face in a first direction and additionally including another plurality of like raised cam surfaces facing in a second direction opposite to said first direction.
6. The magnetostrictive drive motor as defined by claim 1 wherein said at least one and another plurality of like raised cam surfaces are alternately spaced inside of said drive ring.
7. The magnetostrictive drive motor as defined by claim 6 wherein said one and another plurality of cam surfaces are equally spaced, respectively.
8. The magnetostrictive drive motor as defined by claim 7 wherein said drive means comprises at least one pair of mutually aligned magnetostrictive rod members each having one end coupled to said drive ring, each said rod member additionally including an activating coil which when energized causes the respective rod member to expand, said expansion causing the other said rod member to contract.
9. The metnetostrictive drive motor as defined by claim 1 wherein said drive ring is comprised of a first and second half ring member and wherein said first half ring member includes said one plurality of cam surfaces, and additionally including another plurality of like raised cam surfaces on said second half ring member.
10. The magnetostrictive drive motor as defined by claim 9 wherein both said plurality of cam surfaces are arranged, one over the other, on the inner circumferential surface of said half ring members.

11. The magnetostrictive drive motor as defined by claim 10 wherein said rollers comprise first and second sets of truncated conical members respectively located at said one and said another plurality of cam surfaces.

12. The magnetostrictive drive motor as defined by claim 11 wherein said one and said another plurality of cam surfaces are equally spaced, said one plurality of cam surfaces facing in a first direction and said another plurality of cam surfaces facing in a second direction opposite said first direction.

13. The magnetostrictive drive motor as defined by claim 12 wherein said first and second sets of conical members have smaller end portions facing outwardly in mutually opposite directions.

14. The magnetostrictive drive motor as defined by claim 13 and additionally including means for biasing pairs of opposing conical members in an outward direction.

15. The magnetostrictive drive motor as defined by claim 13 and additionally including means located externally of said first and second sets of conical members for selectively forcing one of said sets of conical members inwardly against the bias exerted by said means for biasing in order to reduce surface contact between said one set of conical members and said drive shaft drum.

16. The magnetostrictive drive motor as defined by claim 15 wherein said conical members include respective axial bores and additionally including a respective number of spring type spindle members located on said externally located means projecting into said axial bores of said conical members.

17. The magnetostrictive drive motor as defined by claim 15 wherein said means for forcing comprises a pair of magnetizable annular plates arranged on either side of said first and second half ring members.

18. The magnetostrictive drive motor as defined by claim 16 and wherein said drive shaft drum is comprised of first and second half drum members fastened together.

19. The magnetizable drive motor as defined by claim 18 wherein said magnetostrictive drive means comprises at least one pair of mutually aligned magnetostrictive rod members having one end coupled to said drive ring, each rod member including an activating coil which when energized causes the respective rod member to expand and the other rod member, which is unenergized, to contract.

20. The magnetizable drive motor as defined by claim 19 and additionally including at least one support frame located exteriorly of said drive ring for holding said at least one pair of rod members and a motion coupling arm pivotally mounted on said drive shaft and being connected at its ends to the drive ring.

* * * * *